United States Patent
Müller et al.

(10) Patent No.: US 9,935,441 B2
(45) Date of Patent: Apr. 3, 2018

(54) HIGH VOLTAGE CONNECTOR

(71) Applicant: Tesat-Spacecom GmbH & Co. KG, Backnang (DE)

(72) Inventors: Michael Eberhard Müller, Ludwigsburg (DE); Günther Jaumann, Stuttgart (DE); Marc Spies, Leinfelden-Echterdingen (DE); Dieter Schneider, Backnang (DE)

(73) Assignee: Tesat-Spacecom GmbH & Co. KG (DE)

( * ) Notice: Subject to any disclaimer, the term of this patent is extended or adjusted under 35 U.S.C. 154(b) by 0 days.

(21) Appl. No.: 15/185,211

(22) Filed: Jun. 17, 2016

(65) Prior Publication Data

US 2016/0372905 A1    Dec. 22, 2016

(30) Foreign Application Priority Data

Jun. 22, 2015 (DE) .................... 10 2015 007 882

(51) Int. Cl.
| | |
|---|---|
| *H02G 15/08* | (2006.01) |
| *H02G 3/16* | (2006.01) |
| *H03F 3/58* | (2006.01) |
| *H02G 15/117* | (2006.01) |

(52) U.S. Cl.
CPC ............. *H02G 3/16* (2013.01); *H02G 15/117* (2013.01); *H03F 3/58* (2013.01)

(58) Field of Classification Search
CPC ..................................................... H02G 15/08
USPC ........................................ 174/74 R, 75 R, 76
See application file for complete search history.

(56) References Cited

U.S. PATENT DOCUMENTS

| | | | |
|---|---|---|---|
| 5,174,515 A | * | 12/1992 | Meier ................. B25J 19/0029 242/388 |
| 5,804,767 A | | 9/1998 | Winfield et al. |
| 8,529,287 B2 | * | 9/2013 | Frenkil ................. B65H 75/06 439/501 |

(Continued)

FOREIGN PATENT DOCUMENTS

| | | |
|---|---|---|
| DE | 67 51 601 U | 1/1969 |
| DE | 10 2005 017472 B3 | 9/2006 |

(Continued)

OTHER PUBLICATIONS

SearchReport EP 16175198.7 (dated Nov. 4, 2016).
DE 10 2015 007 882.8—OA (dated Feb. 1, 2016).

*Primary Examiner* — Henry Choe
(74) *Attorney, Agent, or Firm* — Lerner, David, Littenberg, Krumholz & Mentlik, LLP

(57) ABSTRACT

A high voltage connector for establishing a high voltage connection between two high voltage lines is disclosed, with the high voltage connector including a carrier element with a first guiding groove and a second guiding groove, wherein the carrier element includes a high voltage insulating material, wherein the first guiding groove and the second guiding groove are arranged parallel to one another and extend in the longitudinal direction of the carrier element, and wherein each of the first guiding groove and the second guiding groove is designed for accommodating a wire of each of a first high voltage line and a second high voltage line. In this way, a high voltage connection can be established which is insensitive to electrical interference, as well as mechanically stable and resistive, and also works at critical pressure.

13 Claims, 2 Drawing Sheets

(56) References Cited

U.S. PATENT DOCUMENTS

| | | |
|---|---|---|
| 9,350,443 B2 | 5/2016 | Reinwald et al. |
| 2002/0055300 A1 | 5/2002 | Scherb |
| 2010/0321593 A1* | 12/2010 | Kunii ................ G02F 1/133604 |
| | | 348/790 |
| 2013/0175854 A1* | 7/2013 | Chamberlin .......... B60L 3/0069 |
| | | 307/9.1 |
| 2013/0240646 A1* | 9/2013 | Dietrich ................ B05B 5/0533 |
| | | 239/690 |
| 2013/0276840 A1* | 10/2013 | Farruggia ................. B08B 3/12 |
| | | 134/137 |
| 2015/0144394 A1 | 5/2015 | Webb |

FOREIGN PATENT DOCUMENTS

| | | |
|---|---|---|
| DE | 10 2010 029374 A1 | 12/2011 |
| DE | 10 2013 002 477 A1 | 8/2014 |
| EP | 0 439 284 A1 | 7/1991 |
| EP | 1 206 004 A1 | 5/2002 |
| WO | 00/25402 A2 | 5/2000 |

\* cited by examiner

HIGH VOLTAGE CONNECTOR

FIELD OF THE INVENTION

The description relates to a high voltage connector for establishing an electrical connection between two high voltage lines, a traveling-wave tube amplifier with such a high voltage connector, as well as a satellite with such a traveling-wave tube amplifier.

BACKGROUND OF THE INVENTION

On satellite platforms that are in earth orbit or on other space missions, it is common practice to use traveling-wave tube amplifiers as part of a signal transmission link or communication link. The traveling-wave tube amplifiers essentially consist of a traveling-wave tube (traveling-wave tube, TWT) and a power supply (also referred to as electronic power conditioner, EPC). The TWT and the EPC are connected to one another with a high voltage cable (HV cable, high voltage). The HV cable is an integral component in the TWT because the high voltages require an electrical connection of high quality, i.e. particularly that the electrical connection is insensitive to external electromagnetic influences. After its integration into the TWT, the HV cable can only be exchanged with great effort or not at all. Significant expenditures may therefore arise, particularly for excessively short HV cable lengths or for HV cable repairs. An EPC is a DC power supply that usually generates several DC high voltages up to 10 kV from a direct voltage up to 100 volt. A traveling-wave tube utilizes the DC high voltage for amplifying a high-frequency signal.

The term high voltage refers to a voltage starting at 1000 volt or 1 kV. At these voltage values, the physical phenomena in the lines are incomparable to those occurring when lower voltages are used. For example, there is a particularly high risk of flashovers between lines with different voltage potentials or between lines and the ground, especially at critical pressure. An extension of the high voltage cable is generally considered to be an unacceptable debilitation of the system properties such that one continuous high voltage cable is typically used for the connection of corresponding components. This is the reason why it is particularly challenging if a high voltage cable proves to be excessively short after the assembly of a high voltage component, for example because the system environment has changed or for other reasons.

BRIEF SUMMARY OF THE INVENTION

There may be a need for providing an option which enables connecting high voltage lines and which is suitable, in particular, for use in a vacuum and in zero gravity such as, e.g., on satellites remote from earth.

According to an aspect, a high voltage connector for establishing a high voltage connection between two high voltage lines is disclosed. The high voltage connector comprises a carrier element with a first guiding groove and a second guiding groove, wherein the carrier element comprises a high voltage insulating material, wherein the first guiding groove and the second guiding groove are arranged parallel to one another and extend in the longitudinal direction of the carrier element, and wherein each of the first guiding groove and the second guiding groove are designed for accommodating a wire of each of a first high voltage line and a second high voltage line.

The high voltage connector is particularly intended for use with high voltages, i.e. voltages of at least 1 kV and in one embodiment for high voltages of 4 kV or 6 kV and up to 10 kV. A high voltage line may comprise several wires that are respectively realized in the form of an electrical conductor and electrically insulated relative to the other wires.

Guiding grooves are recesses or cavities in a surface of the carrier element such that a wire of a high voltage line can be arranged therein. When a high voltage connection is established between the ends of two corresponding wires of high voltage lines to be connected to one another, the end sections are first stripped and then electrically connected to one another. The connection can be mechanically strengthened by using connection additives (e.g. solder). In other words, an existing high voltage line can be extended, for example, if a wire pair of the two high voltage lines is respectively connected in such a way that an electrical connection is established. An insulation, for example, in the form of a shrink-on sleeve is ultimately arranged around the connection. Such a connection is also referred to as a splice.

The spliced connection point between a wire pair is arranged in a guiding groove of the carrier element. The connection point can represent a mechanical and electromagnetical weak point of the wire, particularly in a high voltage line, because the splice may have a lower mechanical strength than a one-piece and continuous wire and because the subsequently added insulation may have different insulating properties than the original insulation of a wire.

The connection point is arranged in a guiding groove and mechanically fixed at this location. This makes it possible to ensure, in particular, that the connection points between several interconnected wire pairs cannot move relative to one another. A certain distance between the connection points can be observed. It can furthermore be ensured that the wires do not damage one another due to a relative motion, e.g. that the insulating layers of the splices abrade and weaken one another due to a scouring or friction-generating motion.

The carrier element may comprise a plurality of guiding grooves, wherein the number of guiding grooves may be adapted to the number of wires of the high voltage lines to be connected. In one embodiment, for example, the carrier element may comprise twelve guiding grooves in order to connect high voltage lines that respectively comprise twelve wires. When a high voltage connection between two HV lines is established, for example, the wire pairs with the greatest potential difference can be arranged in the guiding grooves of the carrier element in such a way that they have the greatest distance from one another. This can reduce the risk of a flashover.

In the context of this description, a high voltage insulating material is a material designed and suitable for reducing or eliminating the risk of a flashover between adjacent wires of the connected high voltage lines; in this respect, adjacent wires are wires that are not electrically connected to one another, i.e. they are not the two respective wires of the two high voltage lines which are electrically connected to one another. For example, Noryl may be used as high voltage insulating material.

The guiding grooves extend parallel to one another and thereby ensure that a distance between interconnected wires arranged therein is constant or essentially constant in the longitudinal direction of the carrier element. When two wires of the high voltage lines are connected to one another, the quality of the insulation may be altered, especially in the region of the high voltage connection between these two wires, because the original insulation of the wires was removed and, for example, a new insulating element was placed over the electrical connection. The diameter of the electrically conductive wire core may likewise be altered at the splicing point. These splicing points of the wires are arranged in the guiding grooves of the carrier element. Since the guiding grooves are arranged parallel to one another, the risk of a flashover is reduced and the wires exit an end face of the carrier element essentially parallel to one another. This design can also prevent mechanical damages to the insulation of the wires, for example, due to abrasion resulting from vibrations or shocks of the high voltage connector. The wires of the interconnected high voltage lines therefore are only joined and routed into the high voltage lines with a certain distance from the guiding grooves (and therefore from the splices).

In satellites or in other spacecraft, in particular, shocks and vibrations may occur due to the transport into earth orbit and the start-up of devices, wherein these shocks and vibrations can result in strong and impulsive jolts that are transmitted to devices carried along aboard the spacecraft. These jolts can lead to relative motions of the splices with the above-described effects. The high voltage connector described herein reduces the risk of mutual damages to the wires and likewise the risk of a flashover because the spliced wire pairs are arranged and fixed relative to one another at predefined locations.

The high voltage connector is particularly suitable for connecting high voltage lines for up to 10 kV in a space environment. The high voltage connector may be designed such that it complies with the regulations regarding electromagnetic compatibility (EMC) in satellites. To this end, the carrier element may be enclosed by a suitable electromagnetic shield. The spliced wire pairs are held in a shock-resistant and vibration-resistant fashion by the high voltage connector. Due to its design, the high voltage connector described herein is characterized by a low overall weight, for example, of less than 100 gram. The high voltage connector also allows the extension of a HV cable between EPC and TWT even after the integration of the HV cable into the TWT and without the removal of the cable ends of the HV cable from the TWT (or EPC). It furthermore allows the repair of a defective cable between TWT and EPC by removing a section of the HV cable and inserting a new section with the aid of two high voltage connectors.

The high voltage connector of the type described above and below makes it possible to establish a high voltage connection that is insensitive to electrical interference, as well as mechanically stable and resistant.

According to an embodiment, the carrier element comprises a first guiding element and the guiding grooves are arranged on the first guiding element, wherein the carrier element comprises a second guiding element with at least one guiding groove, wherein the first guiding element is arranged on a first surface of the carrier element and the second guiding element is arranged on a second surface of the carrier element, and wherein the first surface is arranged opposite of the second surface.

The guiding grooves therefore may be arranged on two opposite surfaces of the carrier element. For example, the first surface may be an upper side of the carrier element and the second surface may be the underside. If a guiding element with guiding grooves is arranged on the upper side as well as on the underside, the number of guiding grooves can be increased in order to electrically connect high voltage lines with multiple wires to one another.

In this way, the distance between the wires on the upper side and the underside can also be varied according to the distance of the guiding grooves on the guiding element from the surfaces of the carrier element, namely by adapting the height of the guiding element to the respective requirements. For example, the height of the guiding element can be increased during the design phase of the carrier element in order to increase the distance between the wires on the upper side and the underside and to thereby also prevent a flashover between the wires in the guiding grooves at higher voltages.

According to another embodiment, the high voltage connector furthermore comprises a housing, wherein the carrier element is mechanically coupled with a lateral surface of the housing.

The housing may comprise aluminum or an aluminum alloy and serves for protecting the carrier element and the high voltage connection from mechanical and electromagnetic influences. The housing may be realized such that the EMC requirements in an intended operating environment of the high voltage connector are met.

According to another embodiment, at least one surface of the housing comprises an opening that can be closed with a cover.

The opening in the housing allows easy access to the carrier element in order to arrange the spliced wires of the high voltage lines thereon.

According to another embodiment, the housing comprises a raised section (also: collar or lip) that at least partially surrounds the opening of the housing.

The raised section, which may also completely surround the opening, consists of a step or a raised edge (also referred to as DC edge) designed for protecting the interior space of the housing from external electromagnetic influences. Consequently, this edge improves the EMC strength of the housing and therefore the protection of the splices between the connected wire pairs against external electromagnetic influences.

According to another embodiment, the housing comprises a cover that closes the opening, wherein a recess is provided in the cover and arranged such that the raised section is positioned in the recess when the cover closes the opening of the housing.

The recess may consist, for example, of a groove or a cavity that is adapted to the DC edge with respect to its shape and extent. The protection against external electromagnetic influences can be improved due to the engagement of the raised section into the recess.

According to another embodiment, the carrier element comprises two legs and a crosspiece, wherein the two legs extend in the longitudinal direction of the carrier element, wherein the crosspiece extends in the lateral direction of the carrier element and connects the two legs to one another, and wherein the guiding grooves are arranged on the crosspiece.

The carrier element therefore is essentially realized in an H-shaped fashion and the legs are formed by the two sections extending in the same direction, wherein the crosspiece represents the cross connection between these two sections. The guiding grooves extend in the direction of the legs and are arranged on the crosspiece, wherein the wires exit the guiding grooves in the longitudinal direction of the carrier element such that they do not come in contact with a surface of the carrier element or with an edge of such a surface in order to prevent damages to the wire insulation. The guiding grooves particularly may extend perpendicular to the crosspiece and extend as far as an end face of the crosspiece on both ends thereof. The guiding element may be realized integrally with the crosspiece.

According to another embodiment, the crosspiece is concave and tapered toward the center in the lateral direction of the carrier element.

In an embodiment, the crosspiece may be tapered in such a way that it has the shortest longitudinal extent in the center between the two legs.

According to another embodiment, the high voltage connector comprises a flange that is arranged on an end face of the housing and designed for mechanically fixing a high voltage line relative to the housing.

The flange may be designed, in particular, for establishing a force-fit or frictional connection with the high voltage line and form a strain relief for the connections between the wires such that tensile forces acting upon the high voltage line are not transmitted to the splicing points of the wires. A flange particularly may be arranged on both end faces of the housing such that both connected high voltage lines can be fixed.

According to another aspect, a traveling-wave tube amplifier is disclosed, wherein the traveling-wave tube amplifier comprises a traveling-wave tube, a power supply and a high voltage connector of the type described above and below, and wherein the high voltage connector electrically connects a first high voltage line of the traveling-wave tube to a second high voltage line of the power supply.

According to an embodiment of the traveling-wave tube amplifier, a wire of the first high voltage line is electrically connected to a wire of the second high voltage line in a splicing region and the splicing region is arranged in a first guiding groove of the carrier element.

According to another embodiment of the traveling-wave tube amplifier, a fixing mass is arranged in the first guiding groove and fixes the splicing region in the first guiding groove.

The fixing mass can serve for damping and/or preventing motions of the splicing region and the spliced wire pairs relative to the carrier element such that the risk of mechanical damages to the splicing region and the wires is reduced or eliminated. The fixing mass may consist, for example, of a special adhesive that is suitable for applications in a vacuum and zero gravity. However, the fixing mass may also consist of a gelatin-like mass that allows the wires to move in the guiding groove to a certain degree, but dampens these motions.

According to another embodiment of the traveling-wave tube amplifier, the high voltage connector comprises a fixing means and the fixing means is arranged such that it holds the wires in the guiding groove.

The fixing means may consist, for example, of a thread or another flexible elongate element that is coupled to the carrier element and arranged such that it encompasses the wires in order to thereby prevent these wires from escaping from the guiding groove upwardly, i.e. away from the carrier element.

According to another embodiment of the traveling-wave tube amplifier, the fixing means is arranged in front of and/or behind the splicing region referred to the longitudinal direction.

The fixing means therefore does not extend over the splicing region and also not over an additional insulating layer added to the splicing region, but rather in front of or behind the splicing region referred to the longitudinal direction. The closer the fixing means is arranged to the end face of the guiding element, the better the wires can be fixed such that a motion of the wires relative to the carrier element can be reliably prevented or reduced as they exit the guiding grooves. The greater the distance between two fixing points of the fixing means, the better a motion of the spliced wire pair can furthermore be prevented transverse to its longitudinal direction.

According to another aspect, a satellite with a traveling-wave tube amplifier of the type described above and below is disclosed.

The satellite may consist, e.g., of a communication satellite, wherein the traveling-wave tube amplifier is used as part of a communication link.

BRIEF DESCRIPTION OF THE DRAWINGS

Exemplary embodiments are described below with reference to the figures.

DETAILED DESCRIPTION

The figures show schematic representations that are not true-to-scale. Identical or similar reference symbols used in the figures refer to identical or similar elements.

Figure 1:
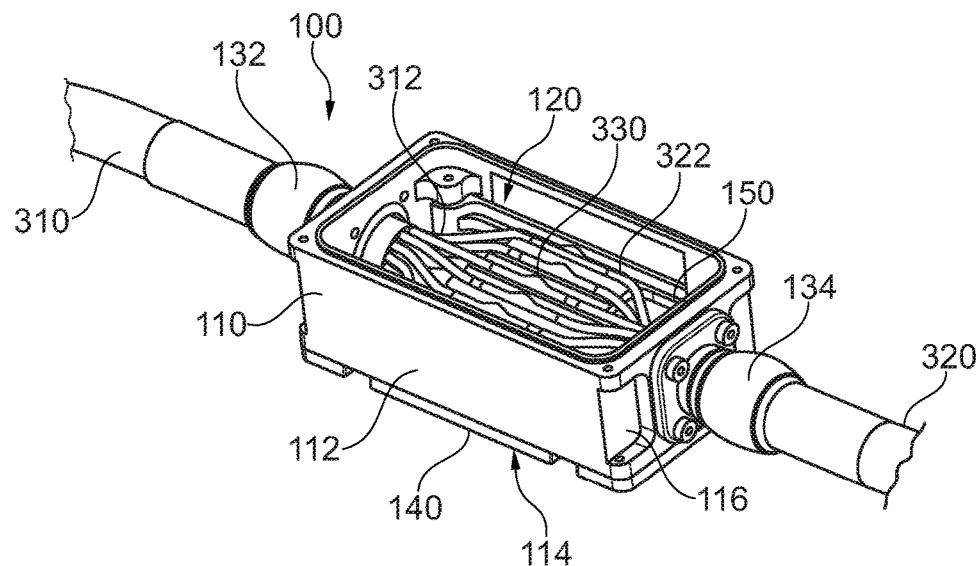
FIG. 1 shows an isometric representation of a high voltage connector according to an exemplary embodiment.

FIG. 1 shows a high voltage connector 100 that electrically connects a first high voltage line 310 to a second high voltage line 320. The high voltage connector 100 comprises a housing 110, wherein a flange 132, 134 is respectively arranged on the end face 116 and on the opposite end face and mechanically fixes one respective high voltage line 310, 320 relative to the housing 110.

The wires 312, 322 of the high voltage lines 310, 320 are visible in the interior space 120 of the housing 110, the upper surface of which is open. The spliced wire pairs are mechanically coupled with or fixed on the carrier element 150 in the connection point 330 or connection region or splicing region. The carrier element is in turn fastened on lateral surfaces 112 of the housing 110. The bottom surface 114 of the housing 110 is closed with a cover. The upper surface shown open can likewise be closed with a cover.

The carrier element 150 may be mechanically coupled with the housing 110, in particular, in the corners of the interior space 120. The carrier element may particularly be fastened on the housing with a screw joint. Due to this arrangement of the fastening points, the fastening elements are spaced apart as far as possible from the splicing points 330 of the wire pairs when the carrier element is centrally arranged in the interior space 120 of the housing 110. The risk of a flashover from the splicing points to the fastening elements and/or the housing can thereby be reduced.

According to FIG. 1, the spliced wire pairs extend parallel to one another in the splicing region, as well as along a section located in front of and behind the splicing region, such that the distance between the wire pairs is nearly constant.

Figure 2:
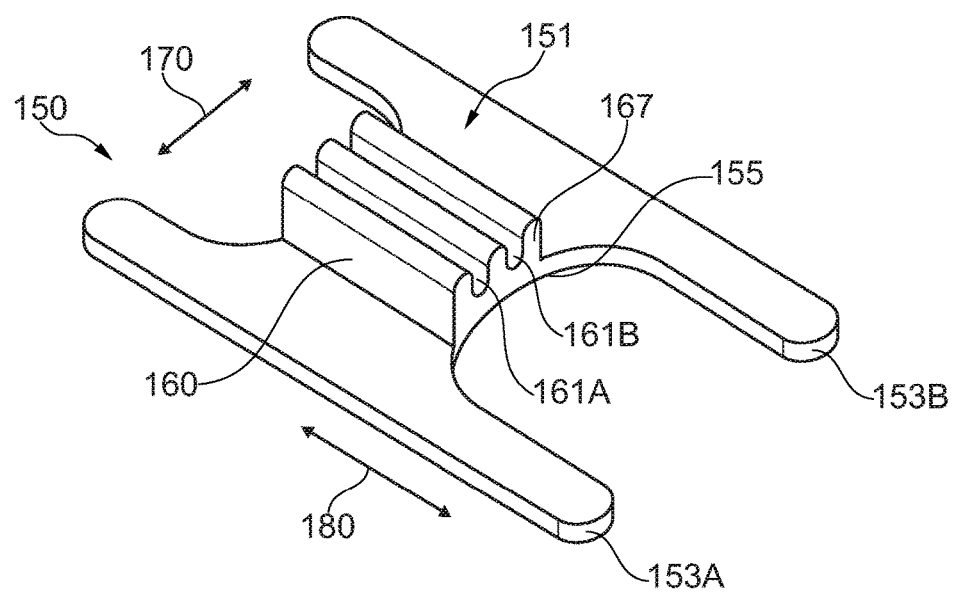
FIG. 2 shows a carrier element for a high voltage connector according to another exemplary embodiment.

FIG. 2 shows a schematic isometric representation of a carrier element 150. The carrier element is formed by two legs 153A, 153B and a crosspiece 155 and essentially realized in an H-shaped fashion. The legs 153A, 153B extend in the longitudinal direction 180 and the crosspiece 155 extends in the lateral direction 170 (perpendicular to the longitudinal direction 180) of the carrier element 150. A guiding element 160 is arranged on the surface 151 of the carrier element on the crosspiece 155. The guiding element 160 represents a shoulder or a raised section on the surface 151 and the guiding grooves 161A, 161B are arranged on the guiding element 160. The guiding grooves consist of recesses that are defined by guiding ribs 167.

It should be noted that the guiding grooves 161A, 161B may also be located directly on the crosspiece 155, namely on the surface 151. The guiding element 160 essentially has the function of establishing a distance between the spliced wire pairs and the surface 151. A second guiding element may also be located on the underside (opposite of the surface 151). In this way, the number of guiding grooves can be increased. The distance between the wire pairs on the upper side and the underside of the carrier element can be predefined in accordance with the respective requirements, i.e. according to the required distance for a flashover protection, by choosing the height of the guiding elements accordingly.

In this exemplary embodiment, the end face 167 of the guiding element 160 ends flush with the edge of the crosspiece 155 such that the wires exiting the guiding grooves on the end face 167 do not come in contact with another edge of the carrier element.

The crosspiece 155 may be realized concave, i.e. tapered toward the center starting from both legs, such that the crosspiece has the shortest longitudinal extent in the center between the two legs.

Figure 3:
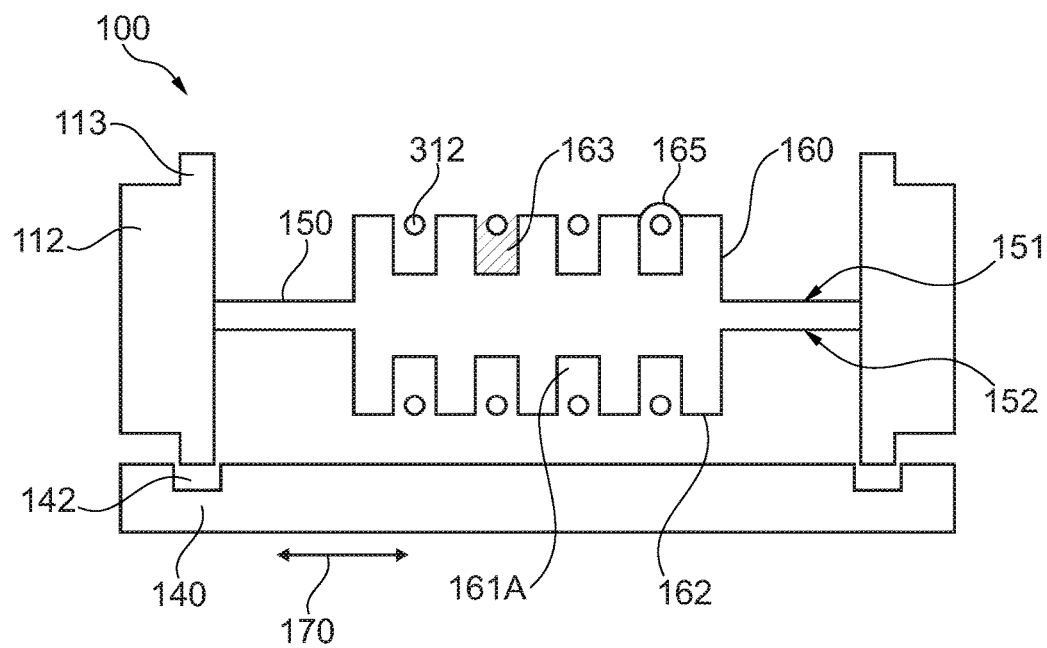
FIG. 3 shows a sectional representation of a high voltage connector according to another exemplary embodiment.

FIG. 3 shows a section view through the high voltage connector 100 at the height of the splicing regions of the wire pairs located in the carrier element. The lateral surfaces 112 of the housing 110 are illustrated on the left side and the right side in this figure. On the underside, the housing is closed with a cover 140. A collar 113 (also: lip or flange) is respectively arranged on the upper and lower ends of the lateral surfaces 112 and represents a step-like raised section on the end of the lateral surface. In this exemplary embodiment, the collar 113 completely surrounds the upper and the lower opening of the housing 110. The cover 140 is provided with a recess 142, which corresponds to the collar 113 with respect to its shape and extent, such that the collar 113 is accommodated in the recess when the cover is placed on the housing in order to close the corresponding opening.

The carrier element 150 comprises two guiding elements 160 that are respectively arranged on the upper side 151 and on the underside 152. The carrier element therefore is respectively realized similar to a comb or a double comb in this region. A guiding groove 161A is arranged between two guiding ribs 162. One spliced wire pair 312 is respectively arranged in each guiding groove. The guiding grooves may be dimensioned such that the wire pairs are at least partially or even entirely accommodated therein, i.e. such that the wire pairs do not protrude over the guiding ribs.

A fixing mass 163 (shaded area) may be arranged in at least some guiding grooves in order to fix the wire pairs located therein relative to the carrier element 150 and to dampen motions of the wire pairs. It should be noted that each wire pair may be fixed in the corresponding guiding groove by means of the fixing mass although this is only illustrated for one guiding groove in order to provide a better overview.

Additionally or alternatively to being fixed by means of the fixing mass, a wire pair may also be fastened in a guiding groove with a fixing means 165. This fixing means may consist, for example, of a thread that connects the two guiding ribs of a guiding groove and closes the guiding groove located between the guiding ribs when a wire is located in the guiding groove. In this way, the corresponding wire cannot escape from the guiding groove. The thread 165 therefore may be connected to the two guiding ribs that define a guiding groove.

The guiding grooves on the upper side and on the underside of the carrier element may lie above each other referred to the lateral direction 170 of the carrier element, i.e. they may be arranged without lateral offset in the lateral direction. In an exemplary embodiment, the guiding grooves on the upper side and on the underside may be offset relative to one another in the lateral direction such that a guiding groove on the underside lies underneath a guiding rib on the upper side and vise versa. The guiding grooves may have a similar extent in the lateral direction (width from left to right in FIG. 3) as the guiding ribs. However, the width of the guiding grooves depends on the dimensions of the spliced wire pairs, wherein the width of the guiding ribs can be affected, in particular, by potential differences between the wire pairs and accordingly varied in order to prevent a flashover.

Figure 4:
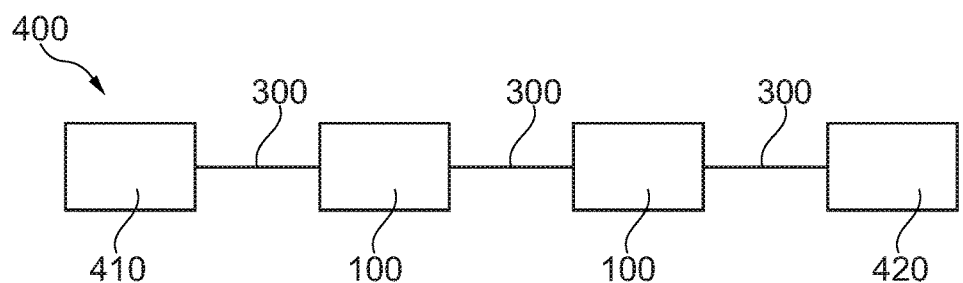
FIG. 4 shows a schematic representation of a traveling-wave tube amplifier according to another exemplary embodiment.

FIG. 4 shows a traveling-wave tube amplifier 400 with a traveling-wave tube 410 and a power conditioner 420. A high voltage line 300 is respectively arranged and, in particular, integrally installed on the traveling-wave tube 410 and on the power conditioner 420. The traveling-wave tube and the power conditioner are electrically connected by means of two high voltage connectors 100 of the type described above, as well as a high voltage line 300 located between said high voltage connectors.

This design makes it possible to configure a traveling-wave tube amplifier 400 in accordance with the respective requirements, namely after the manufacture of the essential components. In this case, the traveling-wave tube can be manufactured with a high voltage line 300 that has a predefined standard length. The length of the high voltage line between the traveling-wave tube and the power conditioner can be adapted by means of the high voltage connector and an additional line section.

Figure 5:
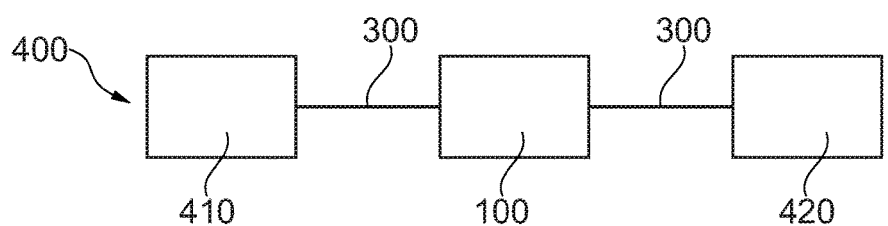
FIG. 5 shows a schematic representation of a traveling-wave tube amplifier according to another exemplary embodiment.

FIG. 5 shows an alternative embodiment of FIG. 4. In this case, the traveling-wave tube 410 and the power conditioner 420 or their high voltage lines 300 respectively are directly connected to a single high voltage connector 100. This configuration can be chosen, for example, when an extension of the line between the TWT 410 and the EPC 420 is not necessary.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS

100 High voltage connector
110 Housing

112 Lateral surface
113 Collar
114 Bottom surface
116 End face
120 Interior space
132 First flange
134 Second flange
140 Cover
142 Recess
150 Carrier element
151 First surface
152 Second surface
153 Fixing leg
155 Crosspiece
160 Guiding element
161A Guiding groove
161B Guiding groove
162 Guiding rib
163 Fixing mass
165 Fixing means
167 End face
170 Lateral direction
180 Longitudinal direction
300 High voltage line
310 First line
312 Wire
320 Second line
322 Wire
330 Connection point, splice
400 Traveling-wave tube amplifier
410 Traveling-wave tube
420 Power conditioner

The invention claimed is:

1. A high voltage connector for establishing a high voltage connection between two high voltage lines, the high voltage connector comprising:
 a carrier element with a first guiding groove and a second guiding groove;
 wherein the carrier element comprises a high voltage insulating material,
 wherein the first guiding groove and the second guiding groove are arranged parallel to one another and extend in the longitudinal direction of the carrier element,
 wherein each of the first guiding groove and the second guiding groove is configured for accommodating a wire of each of a first high voltage line and a second high voltage line,
 wherein the carrier element comprises a first guiding element and the guiding grooves are arranged on the first guiding element;
 wherein the carrier element comprises a second guiding element with at least one guiding groove,
 wherein the first guiding element is arranged on a first surface of the carrier element and the second guiding element is arranged on a second surface of the carrier element, and
 wherein the first surface is arranged opposite of the second surface.

2. A high voltage connector for establishing a high voltage connection between two high voltage lines, the high voltage connector comprising:
 a carrier element with a first guiding groove and a second guiding groove; and
 a housing, wherein the carrier element is mechanically coupled with a lateral surface of the housing,
 wherein the carrier element comprises a high voltage insulating material,
 wherein the first guiding groove and the second guiding groove are arranged parallel to one another and extend in the longitudinal direction of the carrier element,
 wherein each of the first guiding groove and the second guiding groove is configured for accommodating a wire of each of a first high voltage line and a second high voltage line,
 wherein at least one surface of the housing comprises an opening configured to be closed with a cover.

3. The high voltage connector of claim 2, wherein a raised section at least partially surrounds the opening of the housing.

4. The high voltage connector of claim 3, wherein the housing comprises a cover that closes the opening, and
 wherein the cover is provided with a recess arranged such that the raised section is positioned in the recess when the cover closes the opening of the housing.

5. A high voltage connector for establishing a high voltage connection between two high voltage lines, the high voltage connector comprising:
 a carrier element with a first guiding groove and a second guiding groove;
 wherein the carrier element comprises a high voltage insulating material,
 wherein the first guiding groove and the second guiding groove are arranged parallel to one another and extend in the longitudinal direction of the carrier element,
 wherein each of the first guiding groove and the second guiding groove is configured for accommodating a wire of each of a first high voltage line and a second high voltage line,
 wherein the carrier element comprises two legs and a crosspiece;
 wherein the two legs extend in the longitudinal direction of the carrier element and the crosspiece extends in the lateral direction of the carrier element and connects the two legs to one another, and
 wherein the guiding grooves are arranged on the crosspiece.

6. The high voltage connector of claim 5, wherein the crosspiece is concave and tapered toward the center in the lateral direction of the carrier element.

7. The high voltage connector of claim 2, comprising a flange arranged on an end face of the housing and configured for mechanically fixing a high voltage line relative to the housing.

8. A traveling-wave tube amplifier, comprising:
 a traveling-wave tube;
 a power supply; and
 a high voltage connector for establishing a high voltage connection between two high voltage lines, with the high voltage connector comprising:
 a carrier element with a first guiding groove and a second guiding groove;
 wherein the carrier element comprises a high voltage insulating material,
 wherein the first guiding groove and the second guiding groove are arranged parallel to one another and extend in the longitudinal direction of the carrier element,
 wherein each of the first guiding groove and the second guiding groove is configured for accommodating a wire of each of a first high voltage line and a second high voltage line, and
 wherein the high voltage connector is configured to connect a first high voltage line of the traveling-wave tube to a second high voltage line of the power supply.

9. The traveling-wave tube amplifier of claim 8, wherein a wire of the first high voltage line is electrically connected to a wire of the second high voltage line in a splicing region and the splicing region is arranged in a first guiding groove of the carrier element.

10. The traveling-wave tube amplifier of claim 9, wherein a fixing mass is arranged in the first guiding groove and fixes the splicing region in the first guiding groove.

11. The traveling-wave tube amplifier of claim 9, wherein a fixing means is arranged such that it holds the wires in the guiding groove.

12. The traveling-wave tube amplifier of claim 11, wherein the fixing means is arranged in front of or behind the splicing region referred to the longitudinal direction.

13. A satellite with a traveling-wave tube amplifier, the traveling-wave tube amplifier comprising:
a traveling-wave tube;
a power supply; and
a high voltage connector for establishing a high voltage connection between two high voltage lines, with the high voltage connector comprising:
a carrier element with a first guiding groove and a second guiding groove;
wherein the carrier element comprises a high voltage insulating material,
wherein the first guiding groove and the second guiding groove are arranged parallel to one another and extend in the longitudinal direction of the carrier element,
wherein each of the first guiding groove and the second guiding groove is configured for accommodating a wire of each of a first high voltage line and a second high voltage line, and
wherein the high voltage connector is configured to connect a first high voltage line of the traveling-wave tube to a second high voltage line of the power supply.

* * * * *